United States Patent [19]

Miyawaki

[11] Patent Number: 5,084,747
[45] Date of Patent: Jan. 28, 1992

[54] PHOTOELECTRIC CONVERSION DEVICE HAVING CELLS OF DIFFERENT SPECTRAL SENSITIVITIES

[75] Inventor: Mamoru Miyawaki, Sendai, Japan
[73] Assignee: Canon Kabushiki Kaisha, Tokyo, Japan
[21] Appl. No.: 467,197
[22] Filed: Jan. 18, 1990
[30] Foreign Application Priority Data Jan. 18, 1989 [JP] Japan .................. 1-9089

[51] Int. Cl.$^5$ .................. H01L 27/14; H01L 31/04
[52] U.S. Cl. .................. 357/30; 357/24; 250/226
[58] Field of Search .................. 357/30 L, 30 D, 30 J, 357/24 LR, 30 H, 30 P, 30 C, 30 K, 32; 250/226, 208.1, 211 J

[56] References Cited

U.S. PATENT DOCUMENTS

| | | | |
|---|---|---|---|
| 4,663,535 | 5/1987 | Nakai et al. | 250/226 |
| 4,686,554 | 8/1987 | Ohmi | 357/30 |
| 4,786,819 | 11/1988 | Tei | 250/226 |
| 4,847,668 | 7/1989 | Sugawa | 357/30 |
| 4,896,049 | 1/1990 | Ogawa | 250/226 |

FOREIGN PATENT DOCUMENTS 0042429 2/1988 Japan .................. 250/226

Primary Examiner—Rolf Hille
Assistant Examiner—S. V. Clark
Attorney, Agent, or Firm—Fitzpatrick, Cella, Harper & Scinto

[57] ABSTRACT

A photoelectric conversion device has a photoelectric conversion area laminated on a process circuit element for processing electric charges obtained by photoelectric conversion in the photoelectric conversion area. The photoelectric conversion area comprises a plurality of photoelectric conversion cells of which at least two have mutually different spectral sensitivity characteristics and comprises semiconductor materials having different compositions.

33 Claims, 11 Drawing Sheets

PHOTOELECTRIC CONVERSION DEVICE HAVING CELLS OF DIFFERENT SPECTRAL SENSITIVITIES

BACKGROUND OF THE INVENTION

1. Field of the Invention

The present invention relates to a photoelectric conversion device adapted for use in an image reader, for example a copying machine or a facsimile apparatus, or as an image sensor of a video camera, and more particularly to a photoelectric conversion device for color image reading which eliminates light loss and residual images.

2. Related Background Art

At first there will be explained a conventional solid-state color image sensor, with reference to FIGS. 1A and 1B.

FIG. 1A is a cross-sectional view of an example of a photoelectric converting area of a conventional color MOS solid-state image sensor (for example reported in an article "MOS solid-state image sensors commercialized in color video cameras", S. Nagahara, Optronics (1092) No. 3, p. 15–21). In FIG. 1A there are shown an n-type Si substrate 1; a p-well layer 2; a p+ layer 3; a field oxide film 4; an n+ layer 5; a polycrystalline silicon gate 6 for transferring signal charge to a vertical line; an interlayer insulating film 7; a color filter 8, a protective film 9, an n+ drain 10 for receiving signal charge; a vertical line 11 for signal readout; and a light shielding film 12. The p+ layer 3 and n+ layer 5 constitute a photodiode.

As will be apparent from FIG. 1A, within a pixel area A-A', the actual aperture is B-B' so that only a part of the light entering the solid-state image sensor can be converted into the signal charge. The insufficient amount of signal charge has resulted in a limitation in the S/N ratio. This difficulty, becoming more marked as the pixel size grows smaller, has been a major obstacle in realizing a solid-state image sensor which produces a high image quality (namely a high pixel density).

In order to overcome this difficulty, there have been proposed various structures, such as a MOS solid-state image sensor device on which a photoconductive film is laminated (Tsukada T. et al., '79 IDAM, 6.1), and a CCD-type solid-state image sensor device on which a photoconductive film is laminated (Fujimoto S. et al., Color single chip structure for laminate solid-state image sensor, Technical Bulletin of Society of Television TEBS76-2 ED607 p. 7–12, Harada N. CCD-type solid-state image sensor with 2 million pixels for HDTV, laminated by amorphous Si photoelectric conversion film, Nikkei Electronics 1988.2.22).

Among these, a laminate structure on a CCD is shown in FIG. 1B. There are shown a p-Si substrate 21; a p-well layer 22; a channel stop layer 23; a field oxide film 24, wherein the layers 23, 24 serve to separate each pixel; a vertical CCD transfer area; polycrystalline Si layers 26, 27; a Mo electrode 28 for transferring the carriers generated in photoconductive films 29, 30, respectively composed of a ZnSe neubicon film and a ZnCdTe neubicon film, to an n+ layer 36; a transparent electrode 13; color filters 32, 33 of different spectral transmission characteristics; a protective film 34, and a readout gate area 35. Such structure allows to obtain an aperture rate of 100%.

However the conventional solid-state image sensor devices are still associated with drawbacks such as the limitation in the S/N ratio due to the limited signal charge amount, presence of residual image, and color mixing.

Various experiments of the present inventors have clarified that these drawbacks are ascribable to following three points:

1) the transmittance of the color filter as low as 40 to 70%;

2) presence of flow of signal charge into the adjacent pixel; and 3) a low resetting speed in case of the use of a photoconductive film of a high resistance for improving the point 2).

SUMMARY OF THE INVENTION

The present invention has been attained to solve the technical drawbacks mentioned above, and an object thereof is to provide a photoelectric conversion device capable of improving the S/N ratio and eliminating the residual image and the color mixing.

Another object of the present invention is to provide a photoelectric conversion device in which a photoelectric conversion area is laminated on a processing circuit portion for processing the carriers generated in said photoelectric conversion area, wherein said photoelectric conversion area is separately formed for each pixel, and said photoelectric conversion areas are provided with respectively different spectral sensitivity characteristics.

Still another object of the present invention is to provide a photoelectric conversion device capable of a rapid resetting operation, in which the resetting is conducted by selectively connecting a photoelectric conversion layer and a control electrode to a reference voltage source and the accumulation of photogenerated carriers is conducted thereafter.

Still another object of the present invention is to provide a photoelectric conversion device in which a photoelectric conversion area is laminated on a process circuit element for processing the charges obtained by photoelectric conversion in said photoelectric conversion area, wherein said photoelectric conversion area is separated into respectively cells, and is composed of photoelectric conversion cells of at least two different spectral sensitivity characteristics.

Still another object of the present invention is to provide a photoelectric conversion device, comprising integrally:

a first photoelectric conversion element including:
 a first photoelectric conversion cell; and a first transistor provided with a control electrode area electrically connected to said first photoelectric conversion cell and a main electrode area electrically connected to an output circuit including a capacitative load; and a second photoelectric conversion element including:
 a second photoelectric conversion cell; and a second transistor provided with a control electrode area electrically connected to said second photoelectric conversion cell and a main electrode area electrically connected to an output circuit including a capacitative load;

wherein said first and second photoelectric conversion cells are mutually separated and are respectively provided on said first and second transistors, and are composed of materials of mutually different spectral sensitivities.

Still another object of the present invention is to provide a photoelectric conversion device provided with a photoelectric conversion cell having a pair of electrodes, and a transistor provided with a control electrode area of a first conductive type electrically connected to one of the electrodes of said photoelectric conversion cell, and a main electrode area of a conductive type different from that of said control electrode area, comprising first reference potential means to be selectively connected to the other of the electrodes of said photoelectric conversion cell.

DETAILED DESCRIPTION OF THE PREFERRED EMBODIMENTS

Figure 1A:
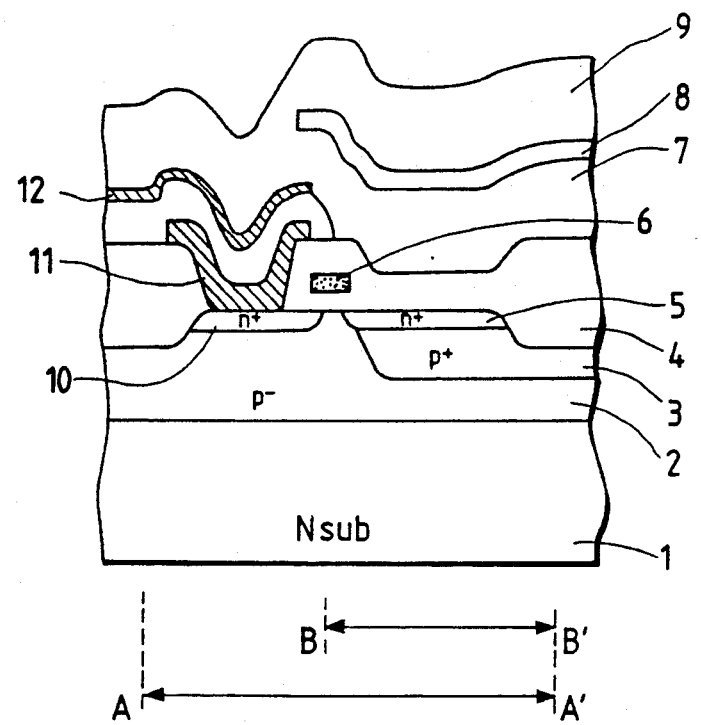
FIGS. 1A and 1B are schematic cross-sectional views of conventional solid-state image sensor devices.
Figure 1B:
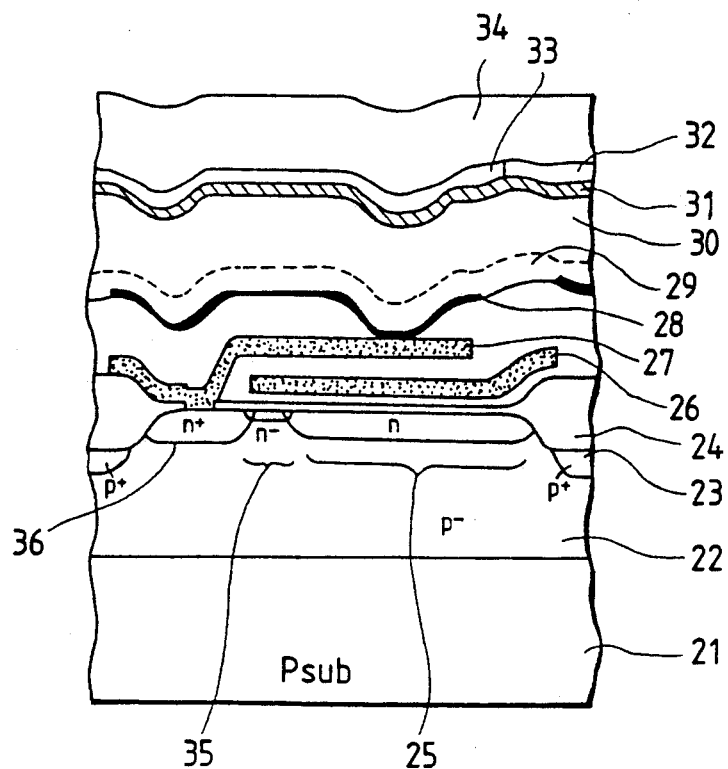

The foregoing objects are attained, according to the present invention, by dividing a photoconductive film constituting a photoelectric conversion layer into respective pixels, and providing the photoconductive film itself with the color filter function.

For providing the photoconductive film with the color filter function, the photoconductive films of the present invention are composed of semiconductor materials of mutually different peak wavelengths in the spectral sensitivity characteristics. More specifically, the color filter function is given to the photoconductive films, by employing a photo-conductive film of spectral sensitivity characteristics with a peak wavelength at red color for the pixels for detecting red color, a film with a peak wavelength at green color for the green-detecting pixels, and a film with a peak wavelength at blue color for the blue-detecting pixels.

Consequently the present invention can provide a photoelectric conversion device for reading a color image, completely free from light loss, thereby giving a larger signal charge and leading to a higher S/N ratio.

Also, the use of the photoelectric conversion layer separated to each cell provides a high resolving power, thereby eliminating the problem of color mixing.

Furthermore, the sensitivity is improved by a structure in which the photogenerated carriers are accumulated in a control electrode area, and a voltage signal corresponding to said carriers is supplied to a readout circuit having a capacitive load and connected to a main electrode area. Particularly, an emitter-follower circuit structure, as in the embodiments 1 to 4 to be described later is extremely advantageous for a high level of integration since the color mixing or crosstalk can be prevented by separating the process circuit elements with a simple structure utilizing a field insulating film and a channel stop.

In addition, the above-mentioned structure can attain a high-speed resetting operation for dissipating the carriers accumulated in the control electrode area, thereby providing a photoelectric conversion device for color image reading, with extremely low residual image and excellent in response.

The photoelectric conversion layer to be employed in the present invention can be of any material exhibiting the above-mentioned spectral sensitivity characteristics, but is preferably composed of an amorphous material with a large design freedom for the spectral sensitivity characteristics due to the relatively free variation in the atomic composition, and more preferably an amorphous material which can be formed through a low temperature process.

Particularly preferred are amorphous materials containing silicon as a constituent and compensated with hydrogen and/or halogen atoms.

Examples of such materials are Si-C with varied compositions for obtaining different spectral sensitivities; a-SiC:H for blue, a-Si:H for green and a-SiGe:H for red; and a-SiN:H for blue, a-Si:H for green and a-SiGe:H for red.

The photoelectric conversion layer may be composed of a combination of plural semiconductors of P, I or N type, or of a single layer structure. Furthermore it may be composed of a superlattice structure, or a Shottky type structure.

The process circuit element to be employed in the present invention may be composed of a field effect transistor, a CCD or a bipolar transistor, but is preferably composed of a structure in which one of the electrodes of the photoelectric conversion layer is connected to a control electrode area (base or gate) of a field effect transistor or a bipolar transistor.

1ST EMBODIMENT

Figure 2:
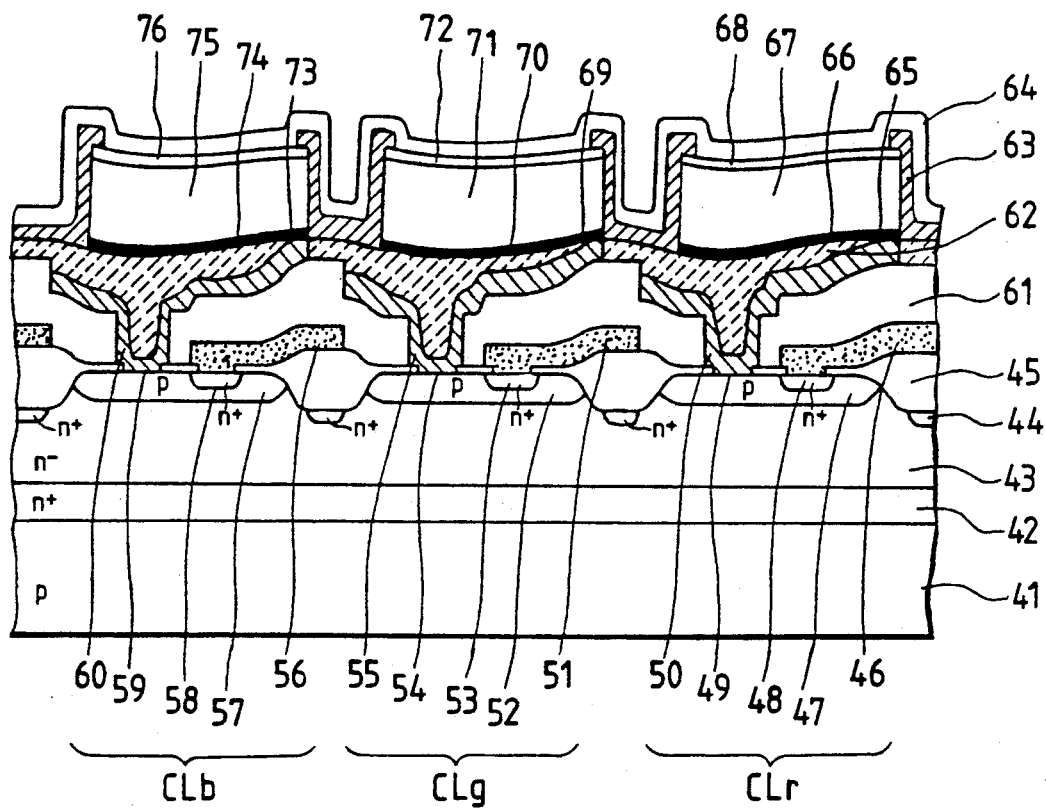
FIG. 2 is a schematic cross-sectional view of a solid-state image sensor device constituting a first embodiment of the present invention.

Now a first embodiment of the present invention will be explained with reference to the attached drawings. FIG. 2 is a cross-sectional view of an area of a solid-state image sensor device constituting an embodiment of the photoelectric conversion device.

In FIG. 2, a unit cell CLr for obtaining a red signal is composed of 46, 47, 48, 49, 50, 66, 67, 68 and 64; while a unit cell CLg for obtaining a green signal is composed of 51, 52, 53, 54, 55, 70, 71, 72 and 64; and a unit cell CLb for obtaining a blue signal is composed of 56, 57, 58, 59, 60, 74, 75, 76 and 64.

In FIG. 2 there are shown a p-Si substrate 41; an n+ embedded layer 42; an n− epitaxial layer 43; an n+ layer 44; and a thick insulating layer 45 formed between adjacent cells, for example by a LOCOS (local oxidation Si) process, and the cells are electrically separated by the layers 44 and 45. Polycrystalline Si emitter electrodes 47, 52, 57 are formed respectively corresponding to the cells. Said electrodes may however be replaced by aluminum electrodes., eventually employing TiN as a barrier metal. There are further provided p-base layers 47, 52, 57 formed in respective cells; n+-emitter layers 48, 53, 58 formed in respective cells; base electrodes 50, 55, 60 formed in respective cells and maintained in contact with the p-base layers 47, 52, 57 through contact holes 49, 54, 59; an insulating layer 62; and lower electrodes 66, 70, 74 of photoconductive films 67, 71, 75, electrically connected with the base electrodes 50, 55, 60 at positions 65, 69, 73. As shown in FIG. 2, the step above the insulating layer 62 is reduced by the presence thereof. The photoconductive films 67, 71, 75 are composed of i-type amorphous silicon carbide, with respective compositions of i-type a-$Si_{1-x(0)}C_{x(0)}$ for the film 67, i-type a-$Si_{1-y}C_{y(0)}$ for the film 71 and i-type a-$Si_{1-z(0)}C_{z(0)}$ for the film 75, wherein "a-" stands for "amorphous". The suffixes x(0), y(0) and z(0) are so determined that they satisfy a relation:

$$x(0) < y(0) < z(0) \tag{1}$$

and that peak spectral sensitivities of about 650 nm, 550 nm and 450 nm are respectively obtained by x(0), y(0) and z(0). Blocking layers 68, 72, 76 for the photoconductive films 61, 62, 63 are respectively composed of p-type a-$Si_{1-x(1)}C_{x(1)}$, p-type a-$Si_{1-x(1)}C_{y(1)}$ and p-type a-$Si_{1-z(1)}C_{z(1)}$, wherein x(1), y(1) and z(1) satisfy following relations:

$$x(0) < x(1) \tag{2}$$

$$y(0) < y(1) \tag{3}$$

$$z(0) < z(1) \tag{4}$$

There are also provided a transparent electrode 64 and an insulating layer 63.

In the following there will be explained the function of the solid-state image sensor device of the present embodiment. At first explanation is made on a cell for obtaining a red signal, for the case of understanding of the basic function.

RESETTING OPERATION

For resetting the potential of the base layer 47 and the photoconductive film 67, the base electrode 50 and the transparent electrode 64 are at first biased at a resetting potential $V_{RESET}$. Then the base electrode 50 is disconnected from the reference potential source, thereby maintaining the base layer 47 in a floating state. Subsequently the emitter electrode 46 is connected to a reference potential source of a potential lower than the resetting potential $V_{RESET}$ thereby resetting again the potential of the base layer.

ACCUMULATING OPERATION

After the resetting operation, a negative pulse (amplitude Δ) is supplied to the transparent electrode 64, whereby it assumes a potential $V_{RESET} - \Delta A$ (>0). In response to the application of said negative pulse, the potential of the base layer 47 is lowered by the capacity $C_{60}$ between the electrodes 66 and 64 across the photoconductive film 67, and an NPN transistor consisting of the emitter 48, base 47 and embedded collector layer 42 is turned off. However the amount Δ' of decline of the potential of the base layer 47 satisfies a relation:

$$|\Delta'| < |\Delta| \tag{5}$$

so that the potential of the base layer is higher than that of the transparent electrode.

Light introduced through the transparent electrode 64 in this state generates electron-hole pairs in the photoconductive film 67. Since the band gap thereof is so selected as to have a peak spectral sensitivity in the vicinity of 650 nm, said electron-hole pairs are most densely generated by the light of a wavelength of 650 nm. The positive holes move toward the transparent electrode 64 and flow out therethrough, due to the electric field in the photoconductive film 67. On the other hand, the electrons move oppositely toward the electrode 66 and reduce, through the base electrode 50, the potential of the base layer 47 according to the amount of incident light.

READOUT OPERATION

Upon termination of the charge accumulating period, the potential of the emitter 48 is reset to an extent that the emitter 48 and the base 47 are not biased in the forward direction, and the emitter electrode 46 is connected to a charge readout capacitor, whereby the emitter is maintained in a floating state. Then the transparent electrode 64 is given a positive pulse (amplitude Δ) which elevates, in an inverse fashion to the start of charge accumulation, the potential of the base layer 47 due to the capacity $C_{60}$ between the electrodes 66 and 64 across the photoconductive film 67, whereby the bipolar transistor consisting of the emitter 48, base 47 and collector 42 is turned on to transfer the potential of the base layer through the emitter 48 to the readout capacitor. The present embodiment, employing a method of base potential decline in proportion to the amount of incident light, has negative-type characteristics in which the signal read by said readout capacitor is largest in the dark state and decreases with the increase in the amount of incident light.

The function of the cells for green and blue light is essentially same as that for red light explained above, except that the photoconductive film 71 for green light has a band gap showing a peak spectral sensitivity at ca. 550 nm while the film 75 for blue light has a band gap showing a peak spectral sensitivity at ca. 450 nm, so that they provide signals in respective wavelength regions.

The above-explained function will now be described in greater detail, with reference to FIGS. 3 and 4.

Figure 3:
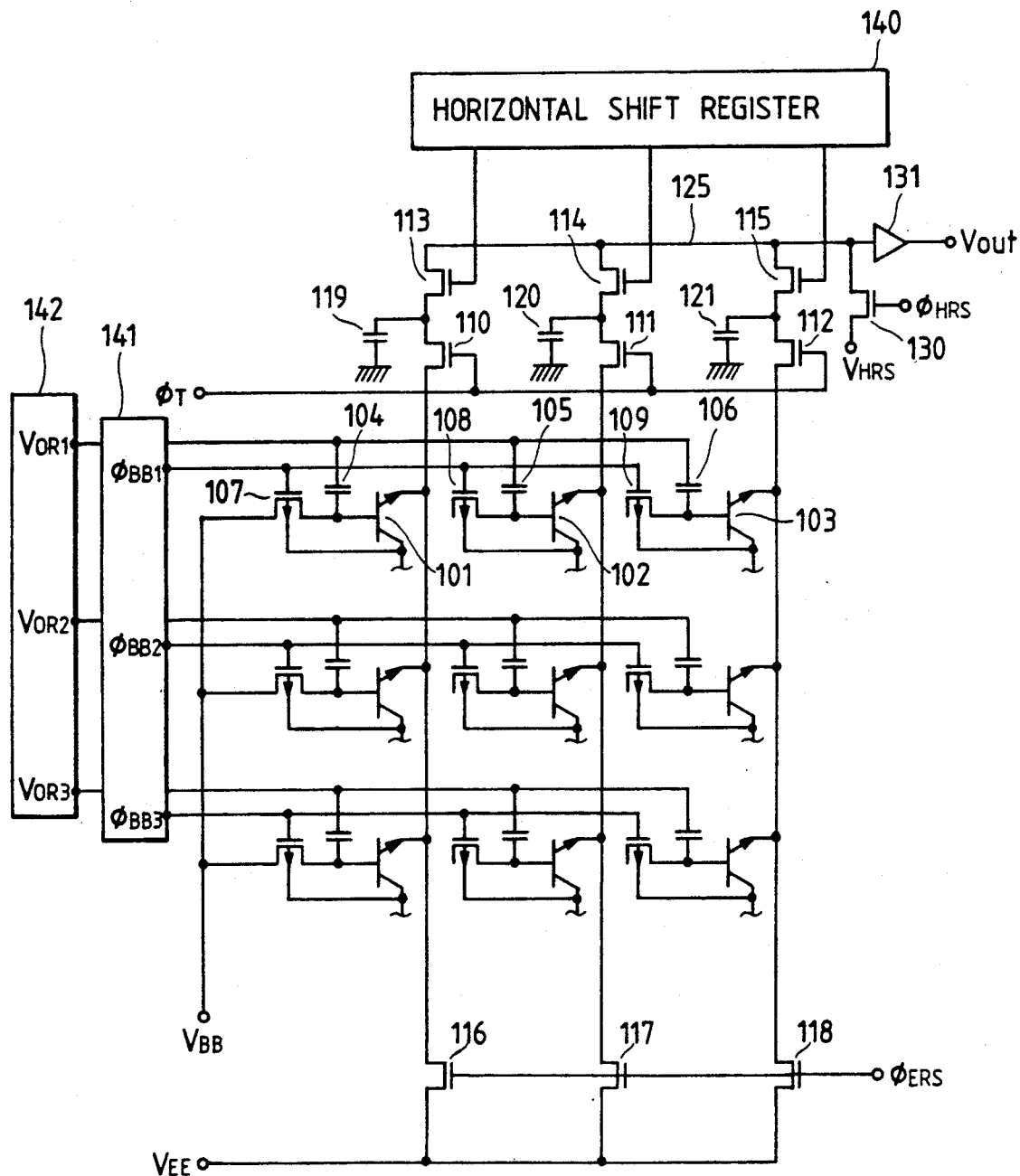
FIG. 3 is a circuit diagram of the solid-state image sensor device shown in FIG. 1.
Figure 4:
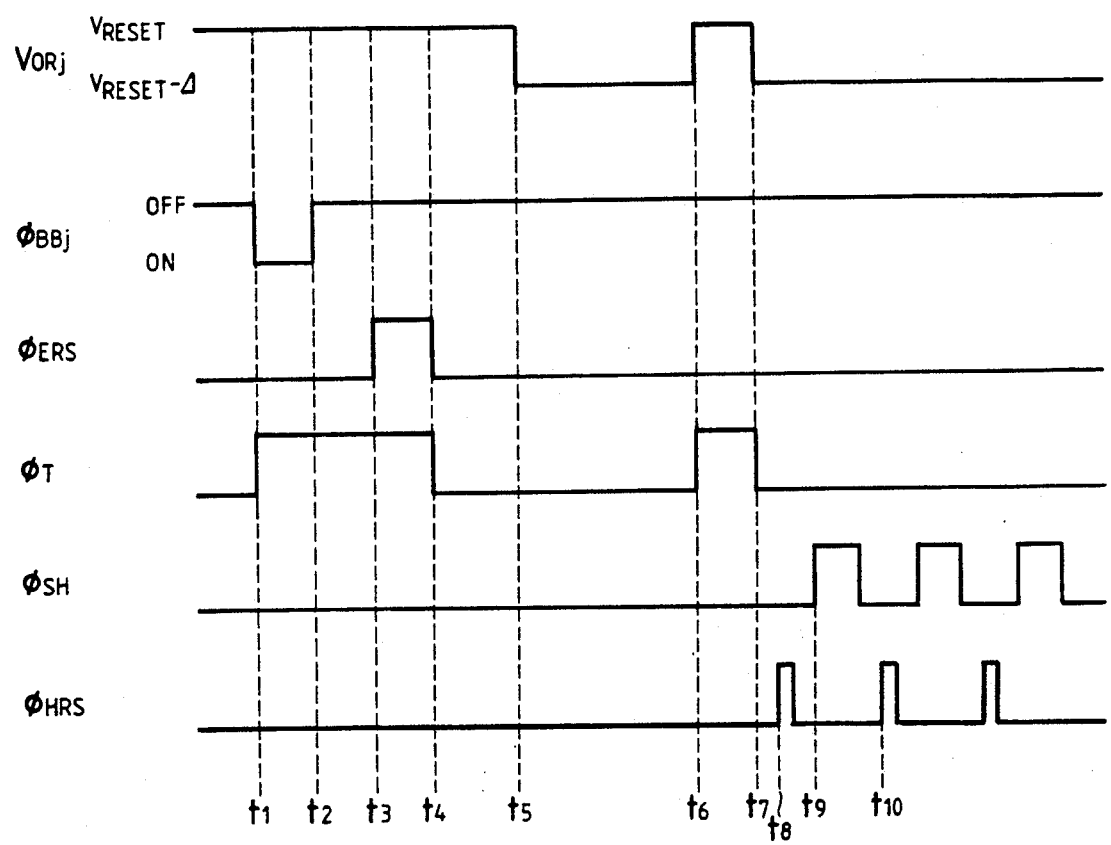
FIG. 4 is a timing chart showing the function of the solid-state image sensor device shown in FIG. 2.

FIG. 3 is a circuit diagram of the solid-state image sensor device of the first embodiment of the present invention, and FIG. 4 is a timing chart showing the function thereof.

For the purpose of simplicity, FIG. 3 shows only three lines respectively for red, green and blue colors, each 3 bits.

In FIG. 3 there are shown: 101, 102, 103: NPN bipolar transistors; 104, 105, 106: capacitances of the photoconductive films; 107, 108, 109: resetting p-channel MOS transistors for maintaining a constant base potential for the NPN transistors; 110, 111, 112: transferring n-channel MOS transistors for transferring the signal charges from the NPN transistors to the capacitances 119, 120, 121; 113, 114, 115: transfer switches to be scanned by a horizontal shift register 140 for successive transfer of the signal charges accumulated in the capacitances 119, 120, 121; 116, 117, 118: resetting n-channel MOS transistors for dissipating the positive holes accumulated in the bases of the NPN transistors and the residual charges of the capacitances of the vertical lines; 130: a resetting switch for resetting a readout line 125; 131: an amplifier; 141: a vertical shift register; and 142: a scanning driver for potential supply to the photoconductive film.

In the following there will be explained the details of the function of the solid-state image sensor device, with reference to a timing chart shown in FIG. 4.

RESETTING OPERATION

When the photoconductive film is biased at $V_{RESET}$, a signal $\phi_{BB}$ is shifted to the low level at $t_1$ to turn on the p-MOS transistors 107, 108, 109 of which base area serves as the source, thereby maintaining the base at the potential $V_{RESET}$ by a terminal $V_{BB}$ serving as the reference potential source. Thus the electrodes of the photoconductive film and the base electrode are maintained at a same potential.

Then said p-MOS transistors are turned off at $t_2$, and the n-MOS transistors 116-118 are turned on at $t_3$ whereby the emitters are brought to a potential lower than the resetting potential $V_{RESET}$ by biasing with the reference potential source $V_{EE}$ in order to dissipate the positive holes accumulated in the bases.

In the present embodiment, as explained above, the positive holes accumulated in the bases are dissipated by the combination of two resetting operations, so that an output signal can be obtained with an extremely low noise level.

ACCUMULATING OPERATION

After the resetting operation, the transparent electrode of the photoconductive film is brought to a potential $V_{RESET}-\delta$ at $t_5$, whereby the potential of the bases is lowered by the capacitances 104-106 of the photoconductive film. Thus the base and emitter of the NPN transistor of each cell are inversely biased to turn off said NPN transistor. If light enters through the transparent electrode in this state, electron-hole pairs are generated in the photoconductive film, and the positive holes move toward the transparent electrode while the electrons move toward the base of the NPN transistor, thereby lowering the potential of the base according to the amount of incident light.

READOUT OPERATION

The potential $V_{OR}$ is shifted to $V_{RESET}$ and the signal $\phi_T$ is shifted to the high level at $t_6$, whereby the signals corresponding to the amount of incident light during the accumulation time, or to the base potentials, are transferred, as signal charges, to the capacitances 119-121.

Then the reset switch 130 is turned on at $t_8$ to reset the line 125, and the transfer switch 113 is turned on at $t_9$ to release the signal charge, accumulated in the capacitance 119, through the amplifier 131. Thereafter the output line 125 is reset again at $t_{10}$.

The above-explained operation is repeated by the horizontal shift register to obtain the color signal of a bit.

The image information is obtained by repeating the resetting operation, accumulating operation and readout operation explained above, by vertical scanning.

In the following there will be explained the manufacturing method of the first embodiment.

A p-Si substrate 41 was surfacially oxidized, then the oxide film was selectively removed in the areas where the embedded collector layers are to be formed, and the n+ embedded layer 42 was formed by diffusion of n-type impurities. Subsequently, the n⁻-layer 43 of a thickness of 2-3 μm was formed with an impurity concentration of $10^{14}$-$10^{15}$cm$^{-3}$ by epitaxial growth. Then, after thermal oxidation and deposition of a nitride film by CVD, the oxide film and the nitrode film were selectively removed in the areas where the separating areas are to be formed, and As ion injection and thermal oxidation were conducted, thereby forming the separating areas with a bird's beak, composed of the oxide film 45 and the n+ layer 44.

In the course of the above-explained process, the impurities of the embodded layer 42 migrate upward whereby the effective thickness of the epitaxial layer of the impurity concentration not exceeding $2 \times 10^{15}$ cm$^{-3}$ becomes 0.2-0.3 μm, thereby obtaining an inclined collector structure with improved large current characteristics.

Figure 5A:
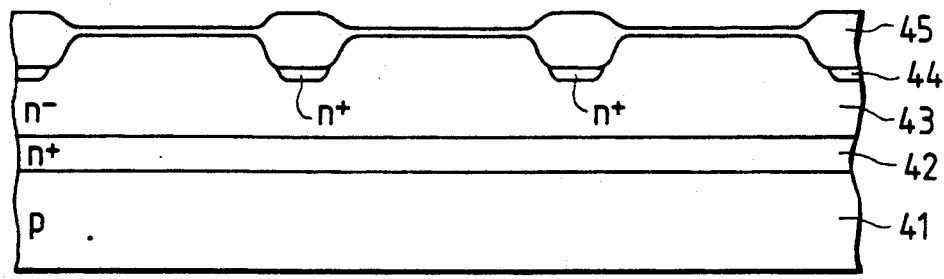
FIGS. 5A to 5F are schematic cross-sectional views showing the manufacturing process of the solid-state image sensor device shown in FIG. 2.

Then, after the nitride film was removed, there were conducted, in succession, diffusion of phosphor in the collector lead areas, removal of the oxide film and thermal oxidation (FIG. 5A).

Figure 5B:
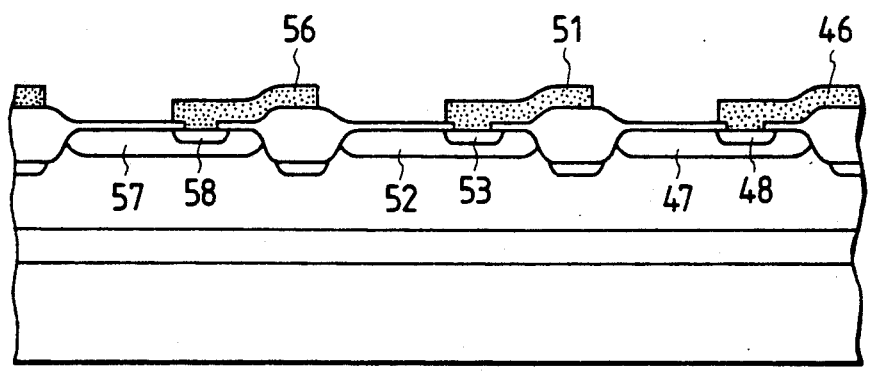
Figure 5C:
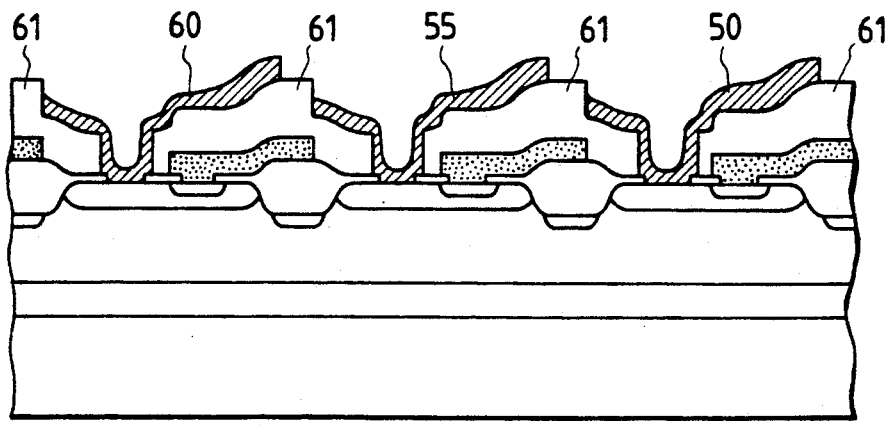

Subsequently b+ ions were implanted, with a dose of $1 \times 10^{13}$ cm$^{-2}$ and an accelerating voltage of 20 keV, in the areas where the base areas are to be formed, utilizing a photoresist mask, and the base areas 47, 52, 57 were formed by annealing. Then, the oxide film for ion implantation was removed, and an oxide film of a thickness of 3000 Å was formed by CVD. Then, As ions were implanted with a dose of $5 \times 10^{14}$ cm$^{-2}$ and an acceleration voltage of 25 keV, and the emitter layers 48, 53, 58 were prepared by annealing. Subsequently the oxide films were removed in the areas where the contact holes of the emitters are to be formed, then a polycrystalline Si film was formed by CVD and patterned by reactive ion etching to form the emitter electrodes 46, 51, 56 (FIG. 5B). Then, the interlayer insulating film 61 was formed by deposition of silicon oxide with CVD, and was removed in the areas for contact with the bases. A Mo film was formed thereon by RF-DC coupled bias sputtering, and was patterned to form the base electrodes 50, 55, 60 (FIG. 5C).

Figure 5D:
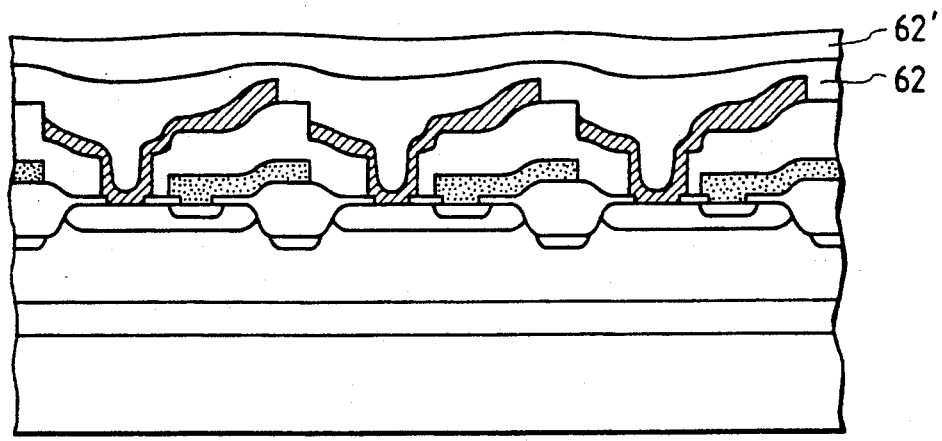

Then, an organic silicon Si(CH$_3$)$_3$(OH) was spin coated and subjected to heat treatment of ca. 400° C. to obtain the insulating film 62. A resist material 62' of an etching speed approximately equal to that of the insulating film 62 was spin coated thereon to planarize the surface (FIG. 5D).

Figure 5E:
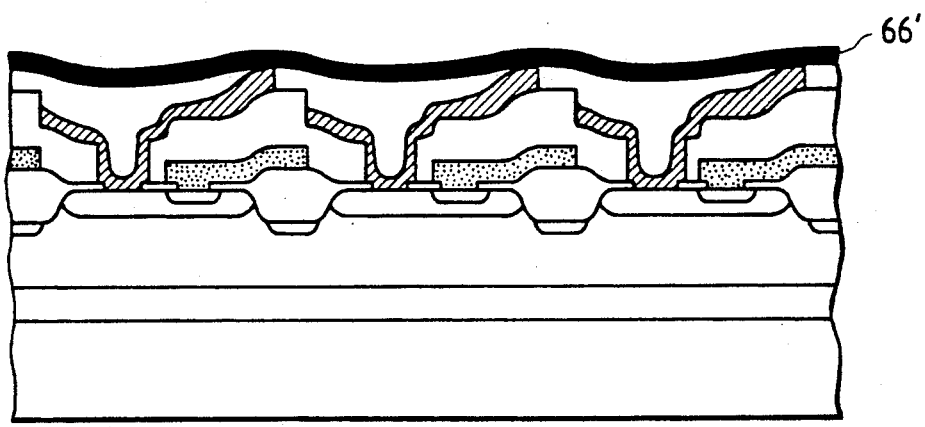

Then, reactive ion etching was conducted until the base electrodes 50, 55, 60 were exposed. On the thus etched-back and planarized surface, the n+ polycrystalline silicon film 66' was formed by CVD (FIG. 5E).

On said film 66', the photoelectric conversion layer was formed by depositing, in succession, the i-type a-SiC:H film and the p-type a-SiC:H film.

Figure 5F:
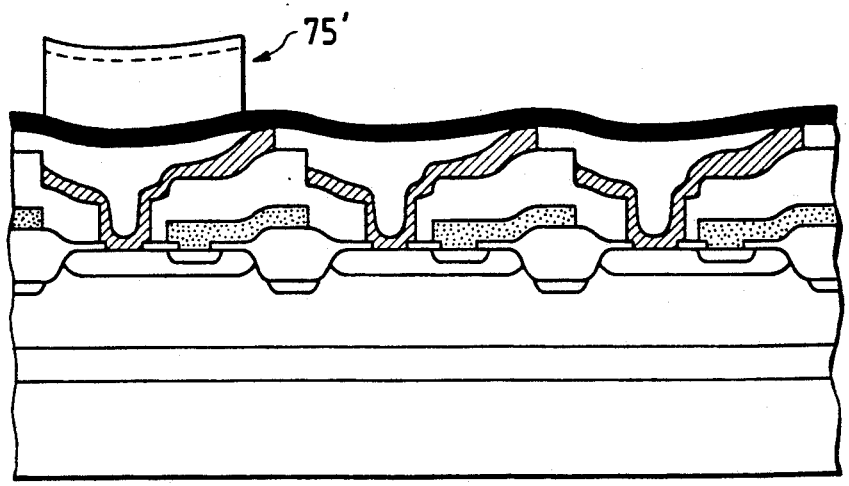

The film formation was conducted by plasma CVD employing SiH$_4$, H$_2$, C$_2$H$_2$ and B$_2$H$_6$ selectively as the source gasses, with an RF power density of 15 mW/cm$^2$, a pressure of 2 Torr and a substrate temperature of 230° C. The photoelectric conversion layer thus formed was patterned to obtain the blue photoelectric conversion area 75' (FIG. 5F).

Then the green color conversion area and the red color conversion area were formed in succession, in a similar manner as the blue color conversion area, by varying the flow rate ratio of $C_2H_2$ and $SiH_4$.

Subsequently, the different color areas and different cells were mutually separated by patterning the lower polycrystalline Si film 66' by reactive ion etching.

The insulating layer 63 was then formed by depositing silicon oxide by CVD, then was holed for contact with the photoelectric conversion areas, and an ITO film was formed as the transparent electrode. The principal part of the solid-state image sensor device as shown in FIG. 2 was completed in this fashion.

As explained in the foregoing, the first embodiment attains high-speed response by high-speed resetting and high-speed readout, since the resetting and the signal readout are conducted by controlling the potential of the base areas serving as the control electrode areas, utilizing the photoelectric conversion layers.

2ND EMBODIMENT

In the following there will be explained a solid-state image sensor device, constituting a second embodiment of the photoelectric conversion device of the present invention, with reference to FIG. 6, wherein same components as those in FIG. 2 are represented by the same numbers or symbols. The present embodiment differs from the first embodiment in two aspects. The first difference is that the blocking layers 77, 78, 79 are respectively composed of n-type a-$Si_{1-x(2)}C_{x(2)}$, n-type a-$Si_{1-y(2)}C_{y(2)}$ and n-type a-$Si_{1-z(2)}C_{z(2)}$, wherein x(2), y(2) and z(2) satisfy:

$$x(0) < x(2) \qquad (6)$$

$$y(0) < y(2) \qquad (7)$$

$$z(0) < z(2) \qquad (8).$$

Figure 6:
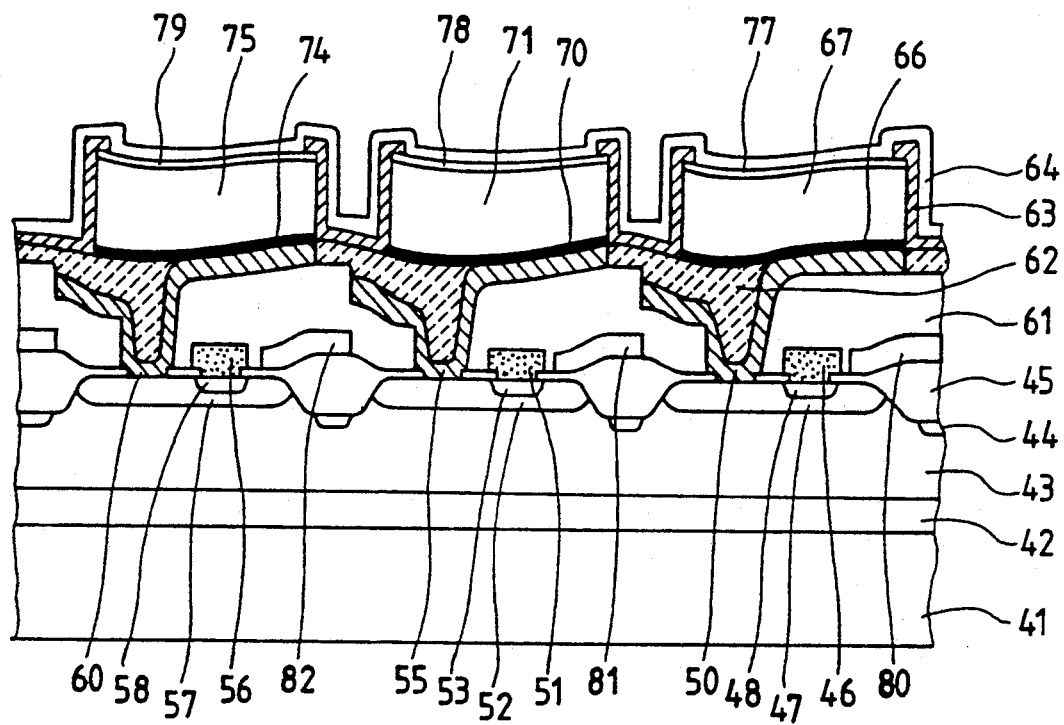
FIG. 6 is a schematic cross-sectional view of a solid-state image sensor device constituting a second embodiment of the present invention.

The second difference is that, as shown in FIG. 6, polycrystalline Si electrodes 80, 81, 82 are respectively provided for the base layers 47, 52, 57, across gate oxide films.

Figure 7:
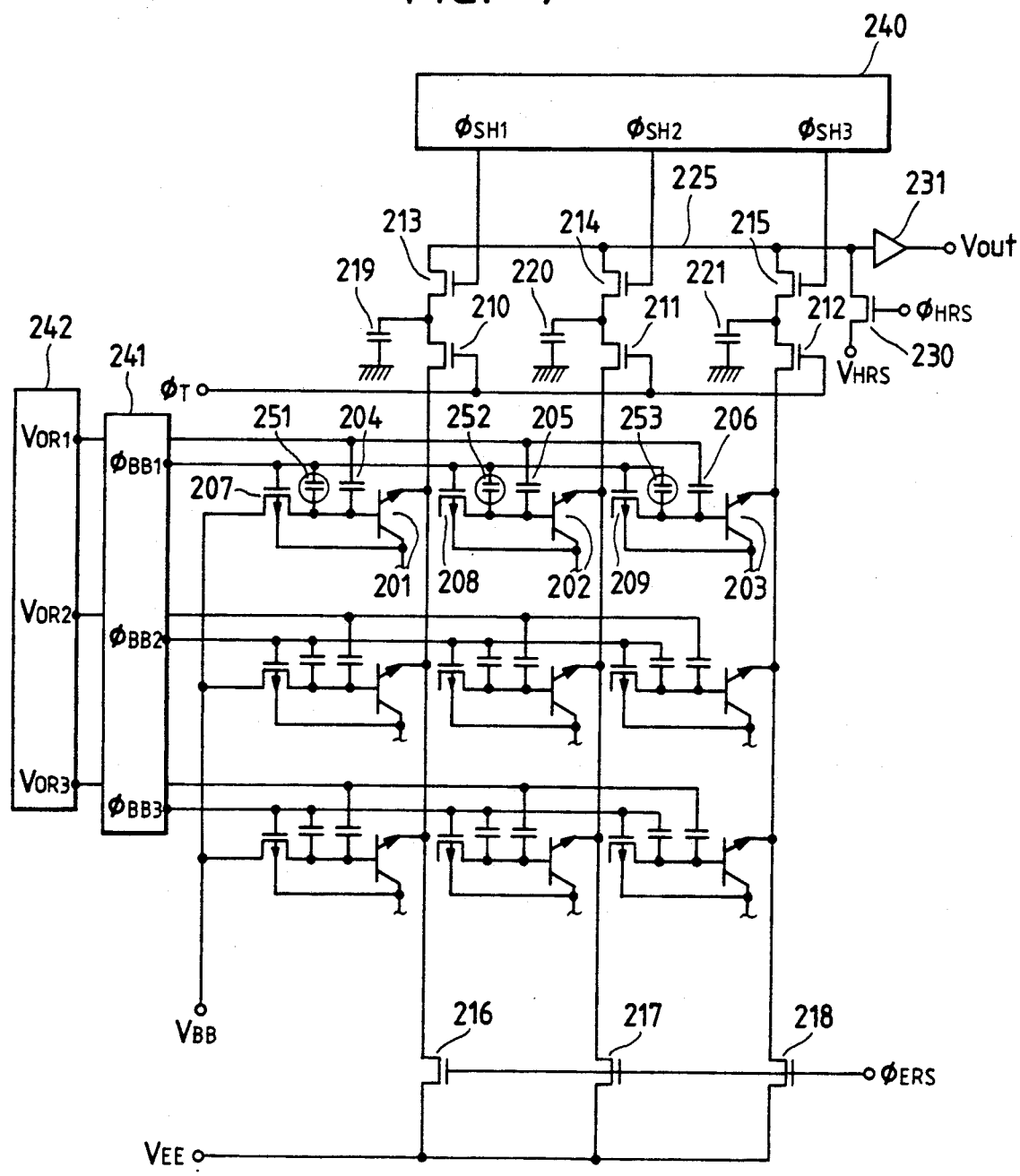
FIG. 7 is a circuit diagram of the solid-state image sensor device shown in FIG. 6.
Figure 8:
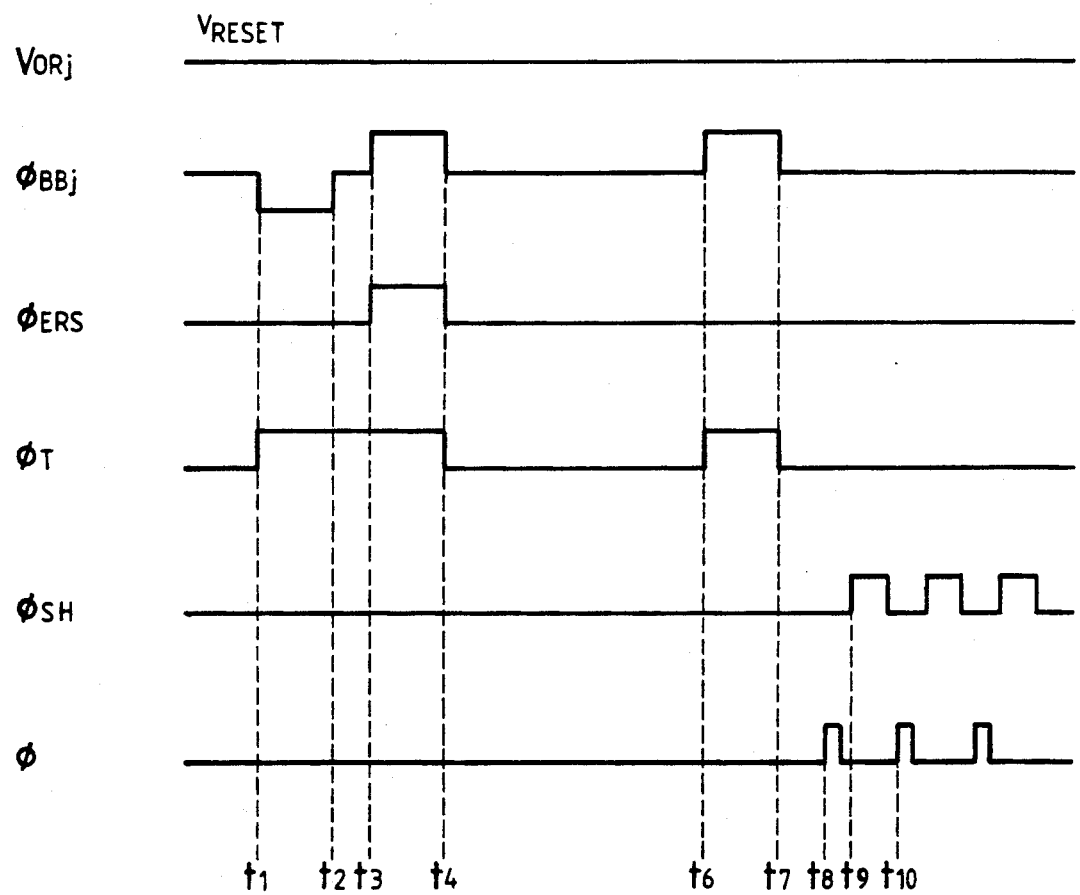
FIG. 8 is a timing chart showing the function of the solid-state image sensor device shown in FIG. 6.

FIG. 7 is a circuit diagram of the solid-state image sensor device of the second embodiment, and FIG. 8 is a timing chart showing the functions thereof.

The circuit is different from that of the first embodiment in the presence of capacitances 251, 252, 253 for respective pixels. The remaining structure is similar to that of the first embodiment, and will therefore be briefly explained. In said circuit there are provided NPN bipolar transistors 201–203; capacitances 204–206 of the photoelectric conversion films; resetting p-MOS transistors 207–209; transferring n-MOS transistors 210–213; transfer switches 213–215; resetting n-MOS transistors 216–218; capacitances 219–221 for accumulating signal charges; an output line 225; a reset switch 230 for resetting the output line 225; an amplifier 231; a horizontal shift register 240; a vertical shift register 241; and a scanning driver 242.

Scanning is made by selecting a horizontal line by the vertical shift register 241 and the driver 242, then effecting the resetting operation, accumulating operation and readout operation, to be described later, on three pixels on said horizontal line, and transferring the signal charges accumulated in the capacitances 219, 220, 221 in succession to the amplifier, by means of the horizontal shift register 240 and the transfer switches 213–215. The image is read by repeating these operations in succession for different horizontal lines.

RESETTING OPERATION

As in the first embodiment, in order to reset the potential of the base layer 47 and the photoconductive film 67, a signal $\phi_{BB}$ is shifted down during a period $t_1-t_2$ to turn on the p-MOS transistor, thereby biasing the base electrode 50 and the transparent electrode 64 at the resetting potential $V_{RESET}$. In this operation, the potential of the transparent electrode 64 may be selected higher than that of the base electrode. Then, at $t_2$, the p-MOS transistor is turned off to cut off the base electrode 50 from the source of said resetting potential $V_{RESET}$ thereby maintaining the base layer 47 in the floating state, and a positive pulse is supplied to the electrode 80 in a period $t_3-t_4$ In response, the potential of the base layer 47 in the floating state is shifted upwards by the capacity $C_{ox}$ between the electrode 80 and the base layer 47, whereby the NPN bipolar transistor consisting of the emitter 48, base 47 and collector 42 is turned on. Thus the base layer 47 is reset again by a current in said bipolar transistor.

Also during the period $t_3-t_4$, a positive pulse $\phi_{ers}$ is supplied to turn on the n-MOS transistor, whereby the emitter of the NPN transistor is reset to a potential $V_{EE}$.

In the present second embodiment, as explained above, in addition to the resetting by the p-MOS transistor and that by the n-MOS transistor, the potential of the floating base is reset by positive biasing through the capacity $C_{ox}$. The base-emitter junction is deeply forward biased in this fashion to dissipate the photogenerated carriers accumulated in said base thereby enabling further reduction of the noises.

ACCUMULATING OPERATION

After the resetting operation explained above, a negative pulse is supplied to the electrode 80 at $t_4$. Said negative pulse shifts the base potential downwards through said capacity $C_{ox}$, whereby the transparent electrode assumes a positive potential while the lower electrode 66 connected to the base electrode assumes a negative potential, with respect to the photoconductive film. Said positive-negative relationship is inverse to that in the foregoing first embodiment. Consequently, when electron-hole pairs are generated in the photoconductive film 67 by the light entering through the transparent electrode 64, the electrons move toward said transparent electrode 64 and flow out therefrom, while the positive holes move through the base electrode 50 and are accumulated in the base layer 47. Therefore the present embodiment, in which the potential of the base layer 47 is elevated in proportion to the amount of incident light, has positive-type characteristics in contrast to the first embodiment.

READOUT OPERATION

At the end of the accumulation period, the emitter electrodes 46 are connected to the capacitances 219–221 for signal readout, and a positive pulse is supplied to the electrode 80. Whereby the base potential is elevated to turn on the bipolar transistor consisting of the emitter 48, base 47 and collector 42. Thus the signal charges corresponding to the carriers accumulated in the bases are given to the capacitances 219–221 connected to the emitters. In this fashion the signals are read as voltages through a deep forward biasing of the base-emitter junction by applying a voltage to the floating base through the capacity $C_{ox}$.

Thereafter, the resetting of the output line 225 and the transfer of the signal charge accumulated in the capacitances 219-221 are repeated ($t_8$-$t_{10}$) as in the foregoing first embodiment.

As explained above, the present second embodiment can achieve an improved response by highspeed resetting and can achieve high-speed signal readout since the resetting is conducted utilizing the photoelectric conversion layer.

THIRD EMBODIMENT

Figure 9:
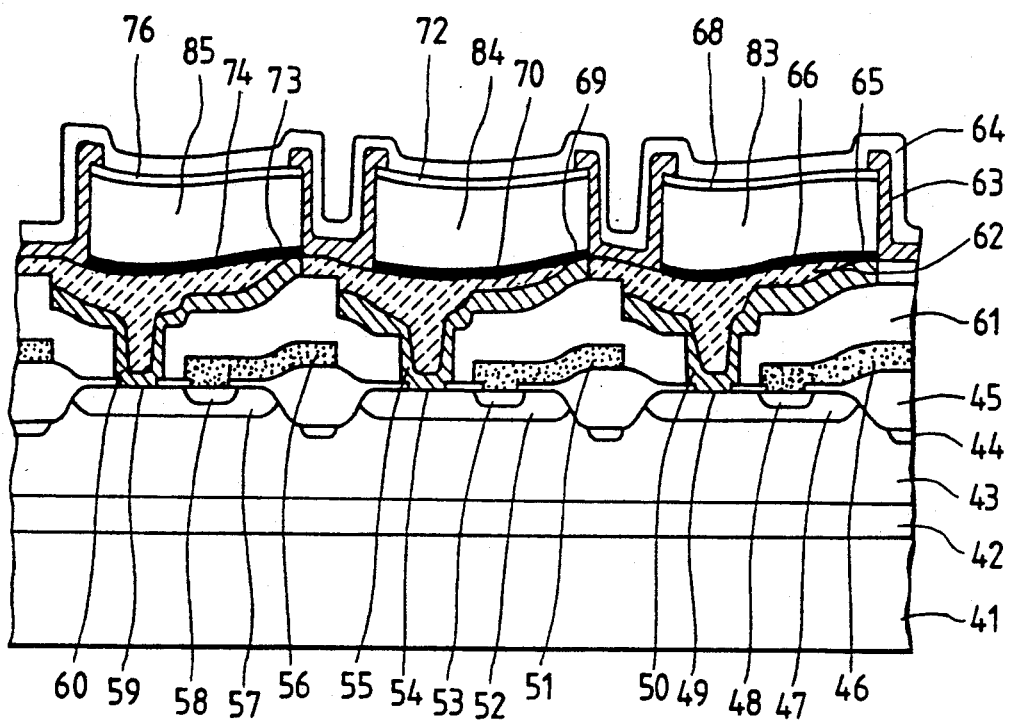
FIG. 9 is a schematic cross-sectional view of a solid-state image sensor device constituting a third embodiment of the present invention.

In the following there will be explained a solid-state image sensor device constituting a third embodiment of the photoelectric conversion device of the present invention with reference to FIG. 9, which is a cross-sectional view of a photoelectric conversion area of the present embodiment, wherein same components as those in FIG. 2 are represented by same numbers or symbols. The present embodiment is different than that shown in FIG. 2 in that a photoconductive film 83 is a superlattice layer consisting of an i-type a-Si layer and a-Si$_{1-x(3)}$C$_{x(3)}$, a photoconductive film 84 is a superlattice layer consisting of an i-type a-Si layer and a-Si$_{1-y(3)}$C$_{y(3)}$, and a photoconductive film 85 is a superlattice layer consisting of an i-type a-Si layer and a-Si$_{1-z(3)}$C$_{z(3)}$. The compositions x(3), y(3) and z(3), the thickness Lw of the a-Si layer constituting the well layer of superlattice, and the thickness La of the a-SiC layer constituting the barrier layer are to be so selected that the peak spectral sensitivities are positioned at about 650, 550 and 450 nm respectively for the photoconductive films 83, 84 and 85. The use of a superlattice structure in the photoconductive film instead of a simple a-SiC layer reduces the resistance of the film, thereby enabling faster resetting of the base layers and the photoconductive films. The function of the device of the present embodiment will not be explained as it is similar to that of the first embodiment.

4TH EMBODIMENT

Figure 10:
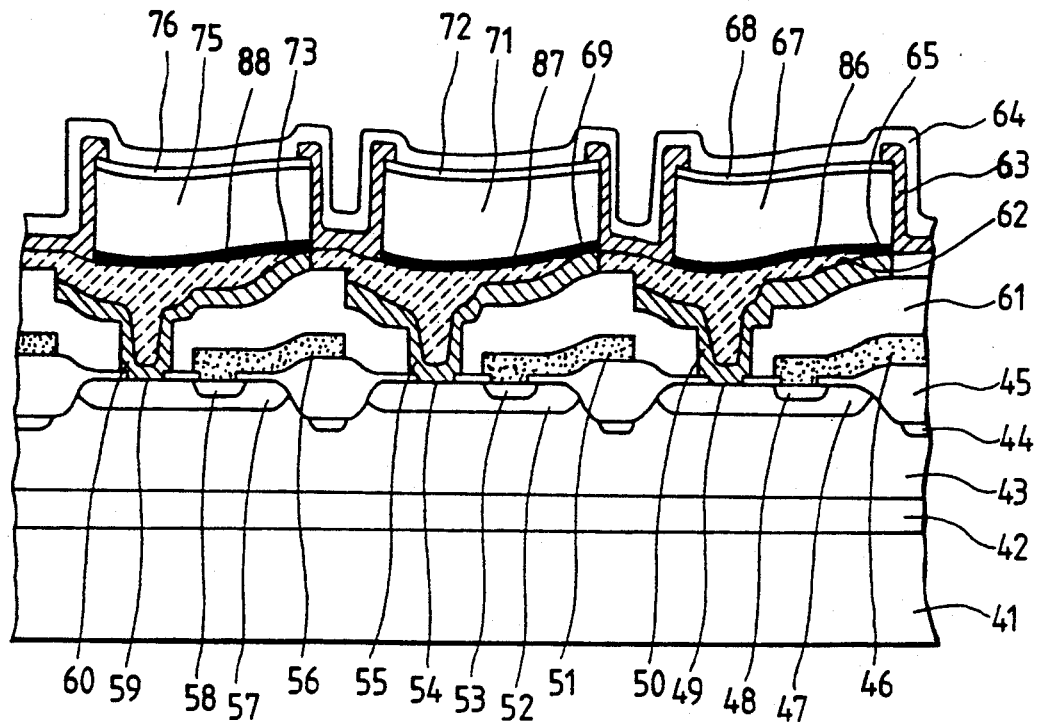
FIG. 10 is a schematic cross-sectional view of a solid-state image sensor device constituting a fourth embodiment of the present invention.

In the following there will be explained a solid-state image sensor device, constituting a fourth embodiment of the photoelectric conversion device of the present invention, with reference to FIG. 10 which is a cross-sectional view of a photoelectric conversion area of the present embodiment, wherein same components as those in FIG. 2 are represented by same numbers or symbols. The present embodiment differs from the first embodiment in that the lower electrodes 86, 87, 88 are respectively composed of n-type a-Si$_{1-x(1)}$C$_{x(4)}$, n-type a-Si$_{1-x(1)}$C$_{y(4)}$ and n-type a-Si$_{1-z(4)}$C$_{z(4)}$, wherein compositions x(4), y(4) and z(4) satisfy:

$$x(0) < x(4) \quad (9)$$

$$y(0) < y(4) \quad (10)$$

$$z(0) < z(4) \quad (11).$$

In the present embodiment, the contact between the base electrode and the photoconductive film is achieved through an n-type a-SiC film.

In the foregoing 1st to 4th embodiments, an a-SiC film is employed as a blocking layer between the transparent electrode and the photoconductive film, but there may naturally be employed a transparent Schottky electrode.

5TH EMBODIMENT

Figure 11:
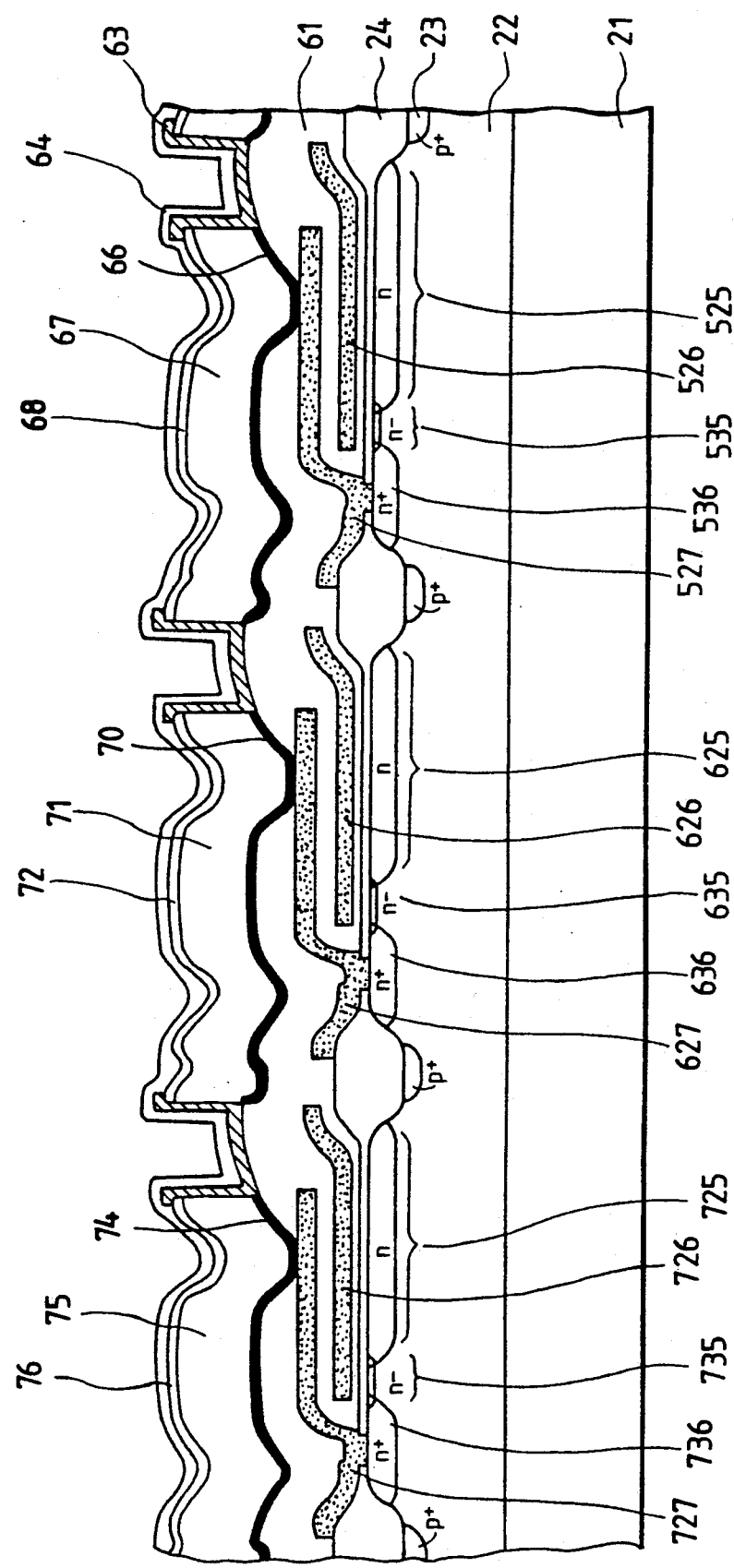
FIG. 11 is a schematic cross-sectional view of a solid-state image sensor device constituting a fifth embodiment of the present invention.

In the following there will be explained a solid-state image sensor device constituting a fifth embodiment of the photoelectric conversion device of the present invention, with reference to FIG. 11, which is a cross-sectional view of a photoelectric conversion area of the present embodiment, wherein same components as those in FIG. 2 are represented by same numbers or symbols. There are provided a p-Si substrate 21; a p-well layer 22; a channel stop layer 23; a thick oxide film 24, wherein cells are mutually separated by the combination of the layers 23 and 24; vertical CCD transfer areas 525, 625, 725 respectively for red signal, green signal and blue signal; polycrystalline Si electrodes 527, 627, 727 for transferring the carriers respectively from the photoconductive films 67, 71, 75 to the n+ layers 536, 636, 736; polycrystalline Si electrodes 526, 626, 726 for controlling the transfer from said layers 536, 636, 736 to the vertical CCD areas 525, 625, 725 and the transfer among the vertical CCD areas; and signal readout gates 535, 635, 735 respectively for red, green and blue signals.

In contrast to the foregoing first to fourth embodiments having bipolar transistors under the photoconductive films, the present embodiment has charge-coupled device (CCD) structures under the photoconductive films.

In the present embodiment, the photoelectric conversion area has a structure the same as that in the first embodiment, but the structures of the second to fourth embodiment may naturally be employed instead.

6TH EMBODIMENT

The present embodiment is same in the basic structure as the first embodiment, but differs therefrom only in the structure of the photoelectric conversion layer.

More specifically, for the blue light conversion layer, the lower electrode was composed of n+ polycrystalline silicon, laminated in succession by an i-type a-Si$_{0.75}$C$_{0.25}$:H layer and a p+ a-Si$_{0.65}$C$_{0.35}$:H layer.

The green color conversion layer was composed of n+ polycrystalline silicon, laminated in succession thereon by an n+ Si:H layer an i-type a-Si:H layer and a p+-type a-Si$_{0.9}$C$_{0.1}$:H layer.

The red color conversion layer was composed of n+ polycrystalline silicon, laminated in succession thereon by an n+-type a-Si$_{0.7}$Ge$_{0.3}$:H layer, an i-type a-Si$_{0.7}$Ge$_{0.3}$:H layer and a p+-type a-Si:H layer.

7TH EMBODIMENT

The present embodiment is same in the basic structure as the 6th embodiment, but differs therefrom only in the structure of the photoelectric conversion layer.

More specifically, the blue color conversion layer was composed of an n+-type a-Si$_{0.8}$N$_{0.2}$:H layer, an i-type a-Si$_{0.8}$N$_{0.2}$:H layer and a p+-type a-Si$_{0.7}$N$_{0.3}$:H layer.

The green color conversion layer was composed of an n+-type a-Si:H layer, an i-type a-Si:H layer and a p+-type a-Si$_{0.9}$N$_{0.1}$:H layer.

The red color conversion layer was same as that in the 6th embodiment.

8TH EMBODIMENT

The present embodiment is same in basic structure as the foregoing embodiment, but differs therefrom only in the structure of the photoelectric conversion layer.

More specifically, the film 83 for red color is composed of a superlattice layer consisting of an i-type a-Si layer and a-SiGe; the film 84 for green color is composed of an i-type a-Si layer; and the film 85 for blue color is composed of a super lattice layer consisting of an i-type a-Si layer and a-SiC.

The photoelectric conversion device according to any of the foregoing 1st to 8th embodiments is integrated on a semiconductor substrate, for example together with a shift register, a driver, photoelectric conversion cells and reference potential sources, and is formed as a chip by sealing for example with transparent resin, with minimum necessary terminal exposed to the outside.

Such chip can be mounted as an image sensor for example in a video camera, and is suitably connected, through the externally exposed terminals, with a control circuit, input signal lines, output signal lines, driving power sources etc. of the main body. It executes reading of a color image in response to commands supplied from the control circuit of the main body, and sends thus obtained image signals to a signal processing circuit.

As detailedly explained in the foregoing, the present invention provides a solid-state color image sensor device which does not require color filters, thereby achieving a fast response, a high sensitivity and a high resolving power.

What is claimed is:

1. A photoelectric conversion device having a photoelectric conversion area laminated on a process circuit element for processing electric charges obtained by photoelectric conversion in said photoelectric conversion area, said photoelectric conversion area comprising a plurality of photoelectric conversion cells of which at least two have mutually different spectral sensitivity characteristics, said at least two photoelectric conversion cells comprising semiconductor materials of different compositions.

2. A device according to claim 1, wherein said photoelectric conversion area is comprised of photoelectric conversion cells having three respectively different spectral sensitivity characteristics.

3. A device according to claim 2, wherein said spectral sensitivity characteristics have spectral sensitivity peaks respectively for blue, green and red light.

4. A device according to claim 2, wherein said spectral sensitivity characteristics have spectral sensitivity peaks respectively for wavelengths of 450, 550, 650 nm.

5. A device according to claim 1, wherein said photoelectric conversion cells comprise nonmonocrystalline materials.

6. A device according to claim 1, wherein said photoelectric conversion cells comprise amorphous materials.

7. A device according to claim 1, wherein each said photoelectric conversion cell includes a PIN structure.

8. A device according to claim 1, wherein each said photoelectric conversion cell comprises a semiconductor layer forming a Schottky junction with at least one of the electrodes thereof.

9. A device according to claim 1, wherein each said photoelectric conversion cell comprises a photoconductive layer and a blocking layer.

10. A device according to claim 1, wherein each said photoelectric conversion cell comprises an I-type semiconductor layer and a p-type semiconductor layer.

11. A device according to claim 1, wherein each said photoelectric conversion cell comprises an i-type semiconductor layer and a n-type semiconductor layer.

12. A device according to claim 1, wherein each said photoelectric conversion cell comprises a superlattice structure.

13. A device according to claim 1, wherein each said photoelectric conversion cell comprise a non-monocrystalline material containing silicon as a constituent.

14. A device according to claim 1, wherein one of said photoelectric conversion cells comprise a-SiC.

15. A device according to claim 1, wherein said photoelectric conversion area comprises a photoelectric conversion cell of a-SiC, a photoelectric conversion cell of a-Si, and a photoelectric conversion cell of a-SiGe.

16. A device according to claim 1, wherein said process circuit element comprises a bipolar transistor.

17. A device according to claim 1, wherein said process circuit element comprises a field effect transistor.

18. A device according to claim 1, wherein said process circuit element comprises a charge-coupled device.

19. A device according to claim 1, wherein said process circuit element comprises a main electrode area and a control electrode area, and wherein said photoelectric conversion area is electrically connected to said control electrode area for accumulating therein a charge based on photogenerated carriers.

20. A device according to claim 19, wherein said process circuit element further comprises a MOS transistor for controlling the potential of said control electrode area.

21. A photoelectric conversion device integrally comprising:
a) a first photoelectric conversion element including:
a first photoelectric conversion cell; and
a first transistor having a control electrode area electrically connected with said first photoelectric conversion cell, and a main electrode area adapted to be electrically connected to an output circuit containing a capacitative load; and
b) a second photoelectric conversion element including:
a second photoelectric conversion cell; and
a second transistor having a control electrode area electrically connected with said second photoelectric conversion cell, and a main electrode area adapted to be electrically connected to an output circuit containing a capacitative load;
wherein said first and second photoelectric conversion cells area mutually separated and are respectively provided on said first and second transistors, and are composed of materials of mutually different spectral sensitivities, said first and second photoelectric conversion cells comprising semiconductor materials of different compositions.

22. A device according to claim 21, further comprising an output circuit which is common to said first and second photoelectric conversion elements.

23. A device according to claim 21, further comprising output circuits is provided independently for each of said first and second photoelectric conversion elements.

24. A device according to claim 21, further comprising:
a third photoelectric conversion element including:
a third photoelectric conversion cell; and
a third transistor having a control electrode area electrically connected with said second photoelectric conversion unit, and a main electrode area adapted to be electrically connected to an output circuit containing a capacitative load;

wherein said third photoelectric conversion cell is separated from said first and second photoelectric conversion cells and comprises a material of a spectral sensitivity different from those of said first and second photoelectric conversion cells.

25. A device according to claim 24, further comprising an output circuit which is common for said first, second and third photoelectric conversion elements.

26. A device according to claim 24, further comprising output circuits provided independently for each of said first, second and third photoelectric conversion elements.

27. A photoelectric conversion device comprising:
a plurality of photoelectric conversion cells having a pair of electrodes, a plurality of photoelectric conversion cells comprising semiconductor materials of at least two different compositions
a plurality of transistors each having a control electrode area of a first conductive type electrically connected to one of the electrodes of a corresponding photoelectric conversion cell, and a main electrode area of a conductive type different from that of said control electrode area; and
first reference potential means to be selectively connected to the other of the electrodes of said photoelectric conversion cells.

28. A device according to claim 27, further comprising second reference potential means to be selectively connected to said control electrode area, wherein said first and second reference potential means provide a same electric potential.

29. A device according to claim 28, wherein, after said first and second reference potential means are respectively connected to the other of the electrodes of one said photoelectric conversion cells and said control electrode area, said main electrode area is connected to a capacitive load for reading a signal.

30. A device according to claim 27, wherein said first reference potential means is connected to the other one of the electrodes of said photoelectric conversion cell at a signal reading time.

31. A potential conversion device according to claim 1, further comprising a signal processing circuit for processing a signal read from said cells.

32. A photoelectric conversion device according to claim 21, further comprising a signal processing circuit for processing a signal read from said cells.

33. A photoelectric conversion device according to claim 27, further comprising a signal processing circuit for processing a signal read from said cells.

* * * * *

UNITED STATES PATENT AND TRADEMARK OFFICE
CERTIFICATE OF CORRECTION

PATENT NO. : 5,084,747

DATED : January 28, 1992

INVENTOR(S) : Mamoru MIYAWAKI

It is certified that error appears in the above-identified patent and that said Letters Patent is hereby corrected as shown below: On the title page, item:

[56] References Cited:
U.S. PATENT DOCUMENTS
    insert -- 3,860,956  1/1975  Kubo, et al. ... 357/48
               4,685,554  8/1987  Ohmi ... 357/30
               4,694,317  9/1987  Higashi et al. ... 357/30
               4,737,833  4/1988  Tabei ... 357/31
               4,847,668  7/1989  Sugawa ... 357/30--

[30] Foreign Application Priority Data:
    insert -- 61-7661   1/86  Japan ...
            2-6967    1/90  Japan ...
            2,044,996 10/80  United Kingdom ... --

COLUMN 1:
    Line 29, "filter 8," should read --filter 8;--;
    Line 30, "film 9," should read --film 9;--;
    Line 50, "Color" should read --"Color--;
    Line 51, "sensor," should read --sensor",-- and "Bulletine"
           should read --Bulletin--;
    Line 52, "CCD-type" should read --"CCD-type--;
    Line 55, "film," should read --film",--;
    Line 59, "film 24," should read --film 25,--; and
    Line 65, "electrode 13; "should read --electrode 31;--.

COLUMN 2:
    Line 46, "respectively" should read --respective--.

COLUMN 3:
    Line 59, "photo-conductive" should read --photoconductive--.

COLUMN 4:
    Line 2 "separated" should read --separate--.

UNITED STATES PATENT AND TRADEMARK OFFICE
CERTIFICATE OF CORRECTION

PATENT NO. : 5,084,747  Page 2 of 4
DATED      : January 28, 1992
INVENTOR(S): Mamoru MIYAWAKI It is certified that error appears in the above-identified patent and that said Letters Patent is hereby corrected as shown below:

COLUMN 5:
  Line 4, "electrodes.," should read --electrodes,--;
  Line 18, "a-$Si_{1-y}C_{y(0)}$" should read --a-$Si_{1-y(0)}C_{y(0)}$--;
  Line 30, "a-$Si_{1-x(1)}C_{y(1)}$" should read --a-$Si_{1-y(1)}C_{y(1)}$--
  Line 63, "$V_{RESET} - \Delta A\ (>0).$" should read
            --$V_{RESET} - \Delta\ (>0).$--; and
  Line 66, "$C_{60}$" should read --$C_\alpha$--.

COLUMN 6:
  Line 32, "$C_{60}$" should read --$C_\alpha$--."

COLUMN 7:
  Line 37, "$V_{RESET}$-$\delta$at" should read --$V_{RESET} - \delta$ at--.

COLUMN 8:
  Line 5, "$n^-$ -layer 43" should read --$n^-$ layer 43--;
  Line 9, "nitrode"   should read --nitride--;
  Line 16, "embodded" should read --embedded--;
  Line 27, "accelerating" should read --acceleration--; and
  Line 61, "$C_2H_2$ and $B2H_6$" should read --$C_2H_2$ and $B_2H_6$--.

COLUMN 9:
  Line 53, "210 - 213" should read --210 - 212--

COLUMN 10:
  Line 15, "$t_3 - t_4$" should read --$t_3 - t_4$.--; and
  Line 60, "electrode 80. Whereby" should read --electrode 80, whereby--.

UNITED STATES PATENT AND TRADEMARK OFFICE
CERTIFICATE OF CORRECTION

PATENT NO.  : 5,084,747

DATED       : January 28, 1992

INVENTOR(S) : Mamoru MIYAWAKI

It is certified that error appears in the above-identified patent and that said Letters Patent is hereby corrected as shown below:

COLUMN 11:
    Line  6, "highspeed" should read --high - speed--;
    Line 25, "a-$Si_{1-x(1)}C_{z(3)}$." should read --a-$Si_{1-z(3)}$.--;
    Line 51, "a-$Si_{1-x(1)}C_{x(4)}$, should read --a-$Si_{1-x(4)}C_{x(4)}$--; and
    Line 52, "a-$Si_{1-x(1)}C_{y(4)}$" should read --a-$Si_{1-y(4)}C_{y(4)}$--.

COLUMN 12:
    Line 32, "embodiment" should read --embodiments--; and
    Line 44, "layer" (1st occurrence) should read --layer,--.

COLUMN 13:
    Line  5, "super lattice" should read --superlattice--.

UNITED STATES PATENT AND TRADEMARK OFFICE
CERTIFICATE OF CORRECTION

PATENT NO.   : 5,084,747                    Page 4 of 4
DATED        : January 28, 1992
INVENTOR(S)  : Mamoru MIYAWAKI It is certified that error appears in the above-identified patent and that said Letters Patent is hereby corrected as shown below:

<u>COLUMN 14</u>:
    Line  3, "a" should read --an--;
    Line  8, "comprise" should read --comprises--;
    Line 11, "comprise" should read --comprises--; and
    Line 60, "is" should be deleted.

<u>COLUMN 15</u>:
    Line 20, "compositions" should read --compositions,--.

<u>COLUMN 16</u>:
    Line 12, "one" should be deleted; and
    Line 19, "potential" should read --photoelectric--.

Signed and Sealed this

Seventh Day of September, 1993

Attest:

BRUCE LEHMAN

*Attesting Officer*          *Commissioner of Patents and Trademarks*